(12) United States Patent
Yu

(10) Patent No.: US 6,630,386 B1
(45) Date of Patent: Oct. 7, 2003

(54) CMOS MANUFACTURING PROCESS WITH SELF-AMORPHIZED SOURCE/DRAIN JUNCTIONS AND EXTENSIONS

(75) Inventor: Bin Yu, Sunnyvale, CA (US)

(73) Assignee: Advanced Micro Devices, Inc, Sunnyvale, CA (US)

( * ) Notice: Subject to any disclaimer, the term of this patent is extended or adjusted under 35 U.S.C. 154(b) by 0 days.

(21) Appl. No.: 09/618,857

(22) Filed: Jul. 18, 2000

(51) Int. Cl.⁷ ............................................. H01L 21/336
(52) U.S. Cl. ..................... 438/305; 438/301; 438/303
(58) Field of Search ................................ 438/305, 306, 438/303, 301, 299, 308

(56) References Cited

U.S. PATENT DOCUMENTS

| | | | |
|---|---|---|---|
| 4,683,645 A | 8/1987 | Naguib et al. | |
| 4,697,333 A | 10/1987 | Nakahara | |
| 4,727,038 A | 2/1988 | Watabe et al. | |
| 4,745,082 A | 5/1988 | Kwok | |
| 4,784,718 A | 11/1988 | Mitani et al. | |
| 4,835,112 A | 5/1989 | Pfiester et al. | |
| 5,017,504 A | 5/1991 | Nishimura et al. | |
| 5,108,954 A | 4/1992 | Sandhu et al. | |
| 5,258,637 A | 11/1993 | Sandhu et al. | |
| 5,264,382 A | 11/1993 | Watanabe | |
| 5,270,232 A | 12/1993 | Kimura et al. | |
| 5,270,382 A | 12/1993 | Ahmed et al. | |
| 5,374,575 A | 12/1994 | Kim et al. | |
| 5,391,510 A | 2/1995 | Hsu et al. | |
| 5,393,685 A | 2/1995 | Yoo et al. | |
| 5,429,956 A | 7/1995 | Shell et al. | |
| 5,434,093 A | 7/1995 | Chau et al. | |
| 5,478,776 A | 12/1995 | Luftman et al. | |
| 5,491,099 A | 2/1996 | Hsu | |
| 5,538,913 A | 7/1996 | Hong | |
| 5,576,227 A | 11/1996 | Hsu | |
| 5,593,907 A | 1/1997 | Anjum et al. | |
| 5,595,919 A | 1/1997 | Pan | |
| 5,607,884 A | 3/1997 | Byun | |
| 5,650,347 A | * 7/1997 | Choi | 438/305 |
| 5,675,159 A | 10/1997 | Oku et al. | |
| 5,716,861 A | 2/1998 | Moslehi | |
| 5,736,435 A | 4/1998 | Venkatesan et al. | |
| 5,736,446 A | 4/1998 | Wu | |
| 5,793,090 A | 8/1998 | Gardner et al. | |
| 5,801,075 A | 9/1998 | Gardner et al. | |
| 5,811,323 A | 9/1998 | Miyasaka et al. | |
| 5,814,544 A | 9/1998 | Huang | |
| 5,817,558 A | 10/1998 | Wu | |
| 5,824,586 A | 10/1998 | Wollesen et al. | |
| 5,825,066 A | 10/1998 | Buynoski | |
| 5,851,869 A | 12/1998 | Urayama | |
| 5,856,225 A | 1/1999 | Lee et al. | |
| 5,858,843 A | 1/1999 | Doyle et al. | |
| 5,885,886 A | 3/1999 | Lee | |

(List continued on next page.)

FOREIGN PATENT DOCUMENTS

| | | |
|---|---|---|
| JP | 3-248433 | 11/1991 |
| JP | 4-123439 | 4/1992 |
| JP | 5-160396 | 6/1993 |

OTHER PUBLICATIONS

Chatterjee, A., et al. "Sub–100nm Gate Length Metal gate NMOS Transistors Fabricated by a Replacement Gate Process", *International Electronics Device Meeting*, 1997 IEEE (5 pages).

(List continued on next page.)

*Primary Examiner*—Michael Trinh
(74) *Attorney, Agent, or Firm*—Foley & Lardner (57) ABSTRACT

A method of manufacturing an integrated circuit may include the steps of annealing a gate structure and a halo section disposed over a substrate using a first temperature, implanting dopants to form drain and source regions, and annealing drain and source regions at a second temperature. The second temperature is substantially less than the first temperature.

20 Claims, 4 Drawing Sheets

U.S. PATENT DOCUMENTS

| | | | |
|---|---|---|---|
| 5,888,888 | A | 3/1999 | Talwar et al. |
| 5,904,530 | A | 5/1999 | Shin |
| 5,908,307 | A | 6/1999 | Talwar et al. |
| 5,915,180 | A | 6/1999 | Hara et al. |
| 5,915,182 | A | 6/1999 | Wu |
| 5,915,183 | A | 6/1999 | Gambino et al. |
| 5,915,196 | A | 6/1999 | Mineji |
| 5,937,297 | A | 8/1999 | Peidous |
| 5,953,602 | A | 9/1999 | Oh et al. |
| 5,953,615 | A | 9/1999 | Yu |
| 5,953,616 | A | 9/1999 | Ahn |
| 5,972,754 | A | 10/1999 | Ni et al. |
| 5,985,726 | A | 11/1999 | Yu et al. |
| 5,998,288 | A | 12/1999 | Gardner et al. |
| 5,998,828 | A | 12/1999 | Ueno et al. |
| 6,004,852 | A | 12/1999 | Yeh et al. |
| 6,022,785 | A | 2/2000 | Yeh et al. |
| 6,030,863 | A | 2/2000 | Chang et al. |
| 6,037,204 | A | 3/2000 | Chang et al. |
| 6,037,640 | A | 3/2000 | Lee |
| 6,072,222 | A | 6/2000 | Nistler |
| 6,080,645 | A | 6/2000 | Pan |
| 6,100,171 | A | 8/2000 | Ishida |
| 6,103,609 | A | 8/2000 | Lee et al. |
| 6,110,783 | A | 8/2000 | Burr |
| 6,133,082 | A | 10/2000 | Masuoka |
| 6,136,616 | A | 10/2000 | Fulford et al. |
| 6,159,813 | A * | 12/2000 | Ahmad et al. ............... 438/305 |
| 6,174,778 | B1 * | 1/2001 | Chen et al. ................. 438/302 |
| 6,180,476 | B1 | 1/2001 | Yu |
| 6,184,097 | B1 | 2/2001 | Yu |
| 6,200,869 | B1 | 3/2001 | Yu et al. |
| 6,225,173 | B1 | 5/2001 | Yu |
| 6,225,176 | B1 | 5/2001 | Yu |
| 6,232,188 | B1 * | 5/2001 | Murtaza et al. ............. 438/300 |
| 6,248,637 | B1 * | 6/2001 | Yu ............................... 438/305 |
| 6,255,174 | B1 * | 7/2001 | Yu ............................... 438/305 |
| 6,265,293 | B1 | 7/2001 | Yu |
| 6,268,640 | B1 | 7/2001 | Park et al. |
| 6,271,095 | B1 | 8/2001 | Yu |
| 6,333,244 | B1 * | 12/2001 | Yu ............................... 438/197 |
| 6,399,452 | B1 * | 6/2002 | Krishnan et al. ........... 438/305 |

OTHER PUBLICATIONS

Journal of Applied Physics, Recrystallization of Implanted Amorphous Silicon Layers I. Electrical Properties of Silicon Implanted with BF+2 or SI+ +B+a), by Tsai, et al., vol. 50, No. 1, Jan. 1979, pp 183–187.

Ultra–Thin–Body Silicon–On–Insulator MOSFET's for Terabit–Scale Integration Yu, et al. pp. 623–626, No month & year.

Sub 50–nm Fin FET: PMOS Huang, et al. 1999 IEEE, 4 pages.

Silicon Processing for the VLSI Era, vol. 1: Process Technology by Wolf, et al. Lattice Press, Sunset Beach California, 1986, pp 296–308.

International Electron Devices Meeting IEDM 97–821 ©1997, IEEE, "Sub–100nm Gate Length Metal Gate NMOS Transistors Fabricated by Replacement Gate Process", 4 pages.

* cited by examiner

CMOS MANUFACTURING PROCESS WITH SELF-AMORPHIZED SOURCE/DRAIN JUNCTIONS AND EXTENSIONS

CROSS REFERENCE TO RELATED APPLICATIONS

This patent application is related to U.S. Pat. No. 6,200,869, by Yu et al., entitled "A Method of Fabricating an Integrated Circuit with Ultra-Shallow Drain/Source Extensions"; U.S. Pat. No. 6,180,476, by Yu, entiled "Dual Amorphization Implat Process for Ultra-Shallow Drain and Source Extencions"; U.S. Pat. No. 5,985,726, by Yu et al., entiled "A Damascence Process for Forming Ultra-Shallow Source/Drain Extensions and Pocket in ULSI MOSFET"; and U.S. Pat. No. 6,225,173, by Yu, entitled "Recessed Channel Structure for Manufacturing Sallow Source/Drain Extensions" all filed on Nov. 6, 1998 and assigned to the assignee of the present invention. In addition, this patent application is related to U.S. Pat. No. 6,271,095, by Yu, entitled "A Locally Confined Deep Pocket Process for ULSI MOSFETS"; U.S. Pat. No. 6,184,097, by Yu, entitled "A Process for Forming Ultra-Shallow Source/Drain Extensions"; and U.S. Pat. No. 6,225,176, by Yu, entitled "Step Drain and Source Junction Formation", all filed on Feb. 22, 1999 and assigned to the assignee of the present invention. The present application is also related to U.S. Pat. No. 6,265,293, by Yu, entitled "CMOS Transistors Fabricated in Optimized RTA Scheme", filed on Aug. 27, 1999 and assigned to the assignee of the present invention. The present application is also, related to U.S. Pat. No. 6,333,244, by Yu, entitled "CMOS Fabrication Process with Differential Rapid Thermal Anneal Scheme", filed on Jan. 26, 2000 and assigned to the assignee of the present invention. The present application is also releated to U.S. application Ser. No. 09/597,623, by Yu, entitled "Dual Amorphization Process Optimized to Reduce Gate Line Over-Melt" and U.S. application Ser. No. 09/597,098, by Yu, entitled "Process Utilizing a Cap Layer Optimized to Reduce Gate Line Over-Melt" filed on Jun. 20, 2000 and assigned to the assignee of the present invention.

FIELD OF THE INVENTION

The present invention relates generally to the field of integrated circuits and to methods of manufacturing integrated circuits. More particularly, the present invention relates to a low thermal budget method of manufacturing an integrated circuit with self-amorphized source/drain junctions and extensions.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETs) or MOSFETs. The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-induced barrier-lowering. Thus, controlling short channel effects is important to assuring proper semiconductor operation.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or ion implantation process. Without the sidewall spacers, the doping process introduces dopants into a thin region (i.e., just below the top surface of the substrate) to form the drain and source extensions as well as to partially form the drain and source regions.

After the drain and source extensions are formed, silicon dioxide spacers, which abut lateral sides of the gate structure, are provided over the source and drain extensions. The substrate is doped a second time to form the deeper source and drain regions. The source and drain extensions are not further doped due to the blocking capability of the silicon dioxide spacers.

As the critical dimensions of transistors continue to shrink, control of thermal budget in IC fabrication is very important. The formation of ultra-shallow source/drain extensions and a super localized halo profile is critical to control short-channel effects. In conventional CMOS processes, high temperature (e.g., >1000° C.) rapid thermal annealing (RTA) is used to activate the dopant in the source, drain, halo, etc. With continually shrinking MOSFET dimensions, high-k materials (e.g., $Al_2O_3$, $TiO_2$, $ZrO_2$, etc.) may be used as gate insulators. Unfortunately, high-k materials tend to react with silicon at high temperatures. As such, the processing temperature has to be kept low (e.g., <800° C.) if high-k materials are to be used as gate dielectrics.

Thus, there is a need for a manufacturing process for CMOS integrated circuits in which post-gate processing temperatures are lower such that high-k materials used as gate insulators do not react with silicon. Further, there is a need for a transistor fabrication process which uses a differential anneal strategy. Even further, there is a need for using a heavy dose dopant implant for the shallow source/drain extension and deep source/drain contact junctions such that self-amorphization is possible. Even further still, there is a need for an IC manufacturing process in which a steep source/drain junction is obtained.

SUMMARY OF THE INVENTION

One aspect of one embodiment relates to a method of manufacturing an integrated circuit. The method includes annealing a gate structure and a halo section disposed over a substrate using a first temperature, implanting dopants to form drain and source regions, and annealing drain and source regions at a second temperature. The second temperature is substantially less than the first temperature.

Briefly, another aspect of an exemplary embodiment is related to a process of forming source and drain regions in an integrated circuit. The process includes providing a heavy-dose shallow source and drain extension implant which forms a self-amorphized shallow source and drain extension, providing a heavy-dose deep source and drain implant which forms a self-amorphized deep source and drain, and recrystallizing the shallow source and drain extension and deep source and drain.

Briefly, another aspect of an exemplary embodiment is related to a method of manufacturing a transistor on an ultra-large scale integrated circuit. The transistor has active regions including a source and a drain and a gate insulator made of a high-k material. The method includes the steps of implanting a dopant into a substrate to form a source and drain, in which the dopant has a dosage which causes source and drain to be self-amorphized, and recrystallizing the self-amorphized source and drain by applying a furnace anneal.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
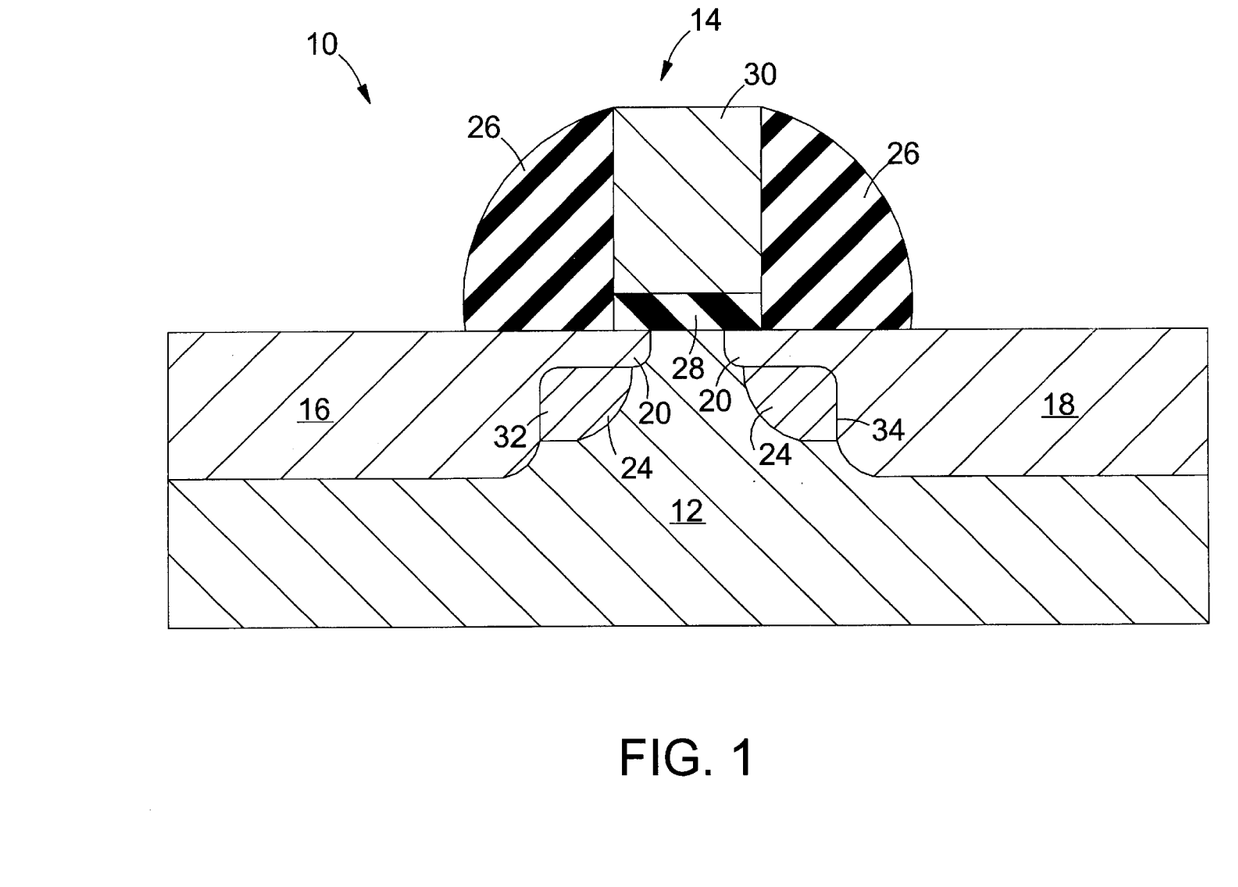
FIG. 1 is a cross-sectional view of a portion of an integrated circuit fabricated in accordance with an exemplary embodiment of the present invention.

Referring to FIG. 1, a portion 10 of an integrated circuit (IC) or chip includes a substrate 12, a gate stack 14, a source region 16, a drain region 18, a source extension 20, a drain extension 22, and halo sections 24. Portion 10 is preferably part of an ultra-large-scale integrated (ULSI) circuit having millions or more transistors. Portion 10 is manufactured as part of the IC on a semiconductor wafer, such as, a silicon wafer.

Substrate 12 is any of a variety of semiconductor materials, such as, silicon. Substrate 12 is preferably a P-type substrate. In an exemplary embodiment, gate stack 14 includes a polysilicon gate electrode or conductor 30 disposed over a gate dielectric or insulator 28, such as thermally grown silicon dioxide. Gate stack 14 is aligned between active regions in substrate 12. Active regions are areas in portion 10 including impurities or dopants such as a p-type dopant (e.g., boron) or an n-type dopant (e.g., phosphorous). Gate stack 14 is located between spacers 26. Spacers 26 are preferably silicon dioxide ($SiO_2$) structures which abut lateral sides of gate stack 14 and are provided at least partially over source region 16 and drain region 18.

Source region 16 and drain region 18 are formed by ion implantation or doping. The dopant is activated by thermal activation or annealing as described below. Source extension 20 is a shallower extension of source region 16. Drain extension 22 is a shallower extension of drain region 18. Preferably, source extension 20 and drain extension 22 extend at least partially below gate stack 14. In one embodiment, these extensions are 20–40 nm deep. In one embodiment, source/drain regions 18 and 20 are 60–100 nm deep. In one embodiment, the width of each extension region is 30–50 nm.

In one method of forming portion 10, different temperature annealing processes are used. A high temperature (e.g., 800° C.) rapid thermal annealing (RTA) is used for annealing gate conductor 30 and halo sections 24. A very low temperature (e.g., 500–600° C.) RTA or furnace anneal is used to activate the dopant in source region 16, drain region 18, source extension 20, and drain extension 22.

A heavy dose (e.g., between $1\times10^{15} cm^{-2}$ and $5\times10^{15} cm^{-2}$) dopant implant is used for the shallow S/D extensions 20; 22 and deep S/D contact junctions. The dopant used can be arsenic (As) or antimony (Sb) for n-channel MOSFET and boron di-flouride ($BF_2$) for p-channel MOSFET. Different from conventional processes, a heavy dose implant creates self-amorphization in both shallow S/D extension area and deep S/D contact junction area.

A very low (e.g., 500–600° C.) anneal is enough to recrystallize the self-amorphized source region 16 and drain region 18 including extensions 20 and 22. Dopant inside the regions 16 and 18 and 20 and 21 become well activated during the mechanism of solid-phase epitaxy. Due to the low thermal budget used, steep junctions 32 and 34 are obtained, which is desirable for transistors with small dimensions.

The method of forming portion 10 is described below with reference to FIGS. 1–4. The method advantageously forms portion 10 including self-amorphized source/drain junctions and extensions. Self-amorphization means that without using the traditional species for an amorphization implant (e.g., Si, Ge), the dopant itself (e.g., Sb, As, etc.) can create an amorphous region during implantation. When the dopant mass is heavy enough, it rearranges the crystalline structure of the silicon substrate during the implantation, leaving an amorphous layer in the silicon substrate.

Figure 2:
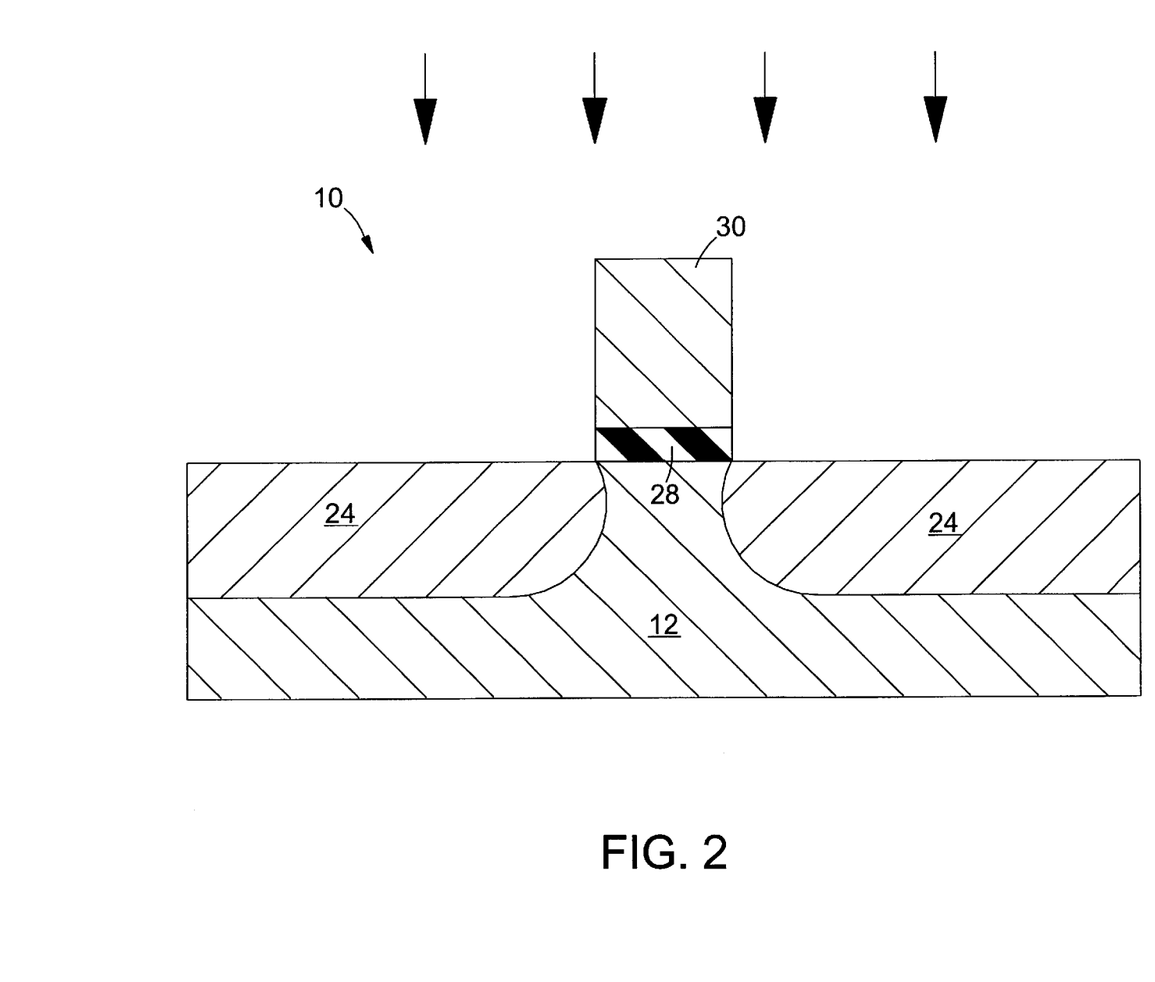
FIG. 2 is a cross-sectional view of a portion of the integrated circuit illustrated in FIG. 1, showing a halo implant step.

In FIG. 2, a cross-sectional view of portion 10 illustrates portion 10 after a conventional CMOS fabrication process is followed to form gate insulator 28 and gate conductor 30. Conductor 30 can be polysilicon or polysilicon germanium material which is doped in the process to be highly conductive or a metal material. Conductor 30 can be deposited by chemical vapor deposition.

After conductor 30 is provided, a halo implant is performed to form halo sections 24. Gate stack 14 and halo sections 24 are annealled. In one embodiment, a high temperature (e.g., 800° C.) RTA is used for proper activation of the dopants without causing gate insulator 28 to react with silicon. Halo sections 24 are 30–70 nm deep and 10–50 nm wide. Preferably, sections 24 are formed by implanting a P-type dopant at $1\times10^{13}$–$1\times10^{14} cm^{-2}$ dose to achieve approximately $1\times10^{18} cm^{-3}$ concentration for an N-channel transistor. N-type dopants are utilized for a P-channel transistor. Ion implantation devices which charge boron (for N-channel) to an energy of 5–20 KeV can form regions 24.

Preferably, conductor 30 is 1,000–2,000 Å thick and 50–200 nm wide. Insulator 28 is 1,000–2,000 Å wide and 15–30 Å thick. Insulator 28 can be silicon dioxide, nitride, or a high-k dielectric material. Conductor 30 can be covered by a cap material such as silicon nitride or silicon oxynitride to protect conductor 30 from the implantation of ions for regions 24. Alternatively, conductor 30 can be doped during the formation of regions 24.

Figure 3:
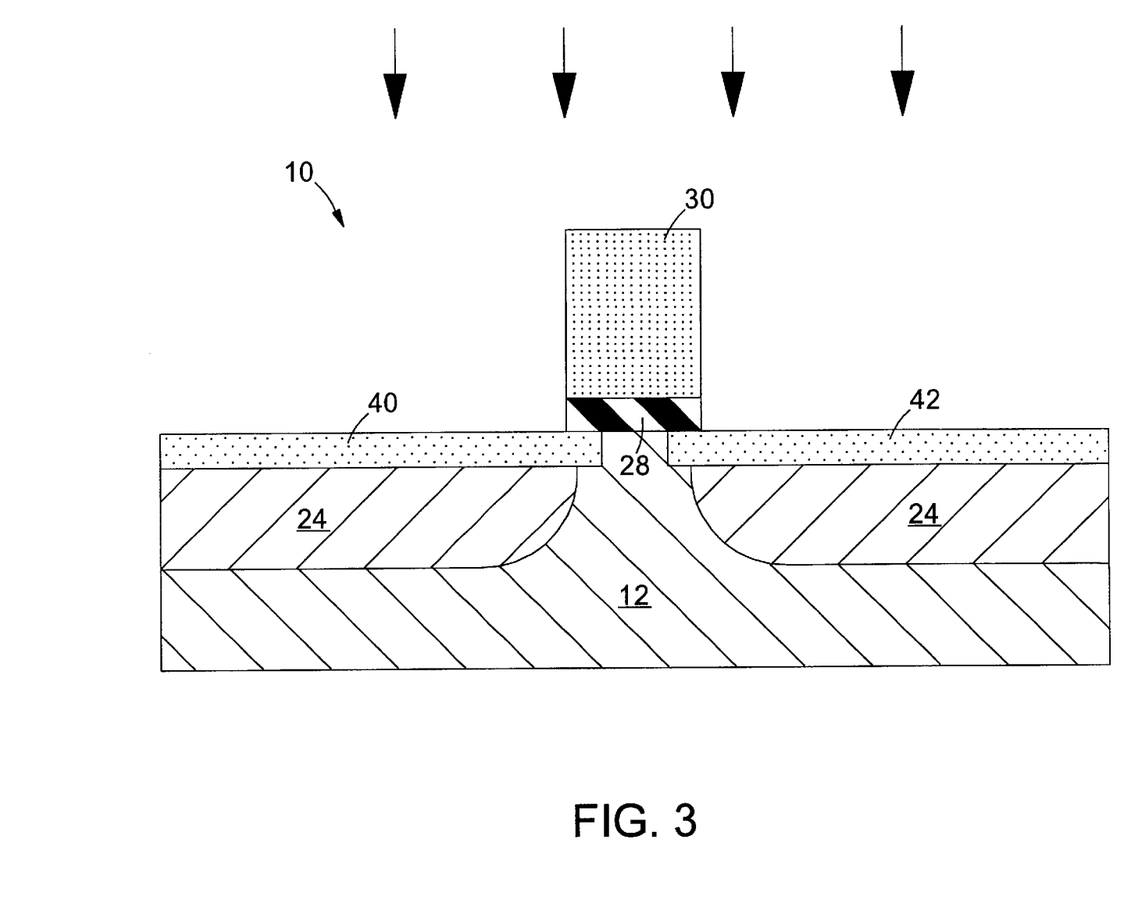
FIG. 3 is a cross-sectional view of a portion of the integrated circuit illustrated in FIG. 2, showing a self-amorphization shallow source/drain extension implant step.

In FIG. 3, portion 10 includes shallow source/drain extension layers 40 and 42 are implanted under a high dose (e.g., between $1\times10^{15} cm^{-2}$ and $5\times10^{15} cm^{-2}$). Layers 40 and 42 are shown as stippled areas in FIG. 3. In an exemplary embodiment, heavy dopants, such as, $BF_2$, As, or Sb are used. Due to the high dose of dopants, shallow source/drain extension layers 40 and 42 become self-amorphized. Self-amorphization occurs because heavy mass dopants displace silicon atoms in substrate 12. Amorphization allows dopants to be activated at lower temperatures. In an exemplary embodiment, shallow source/drain extension layers 40 and 42 have a thickness of 10–30 nm.

Figure 4:
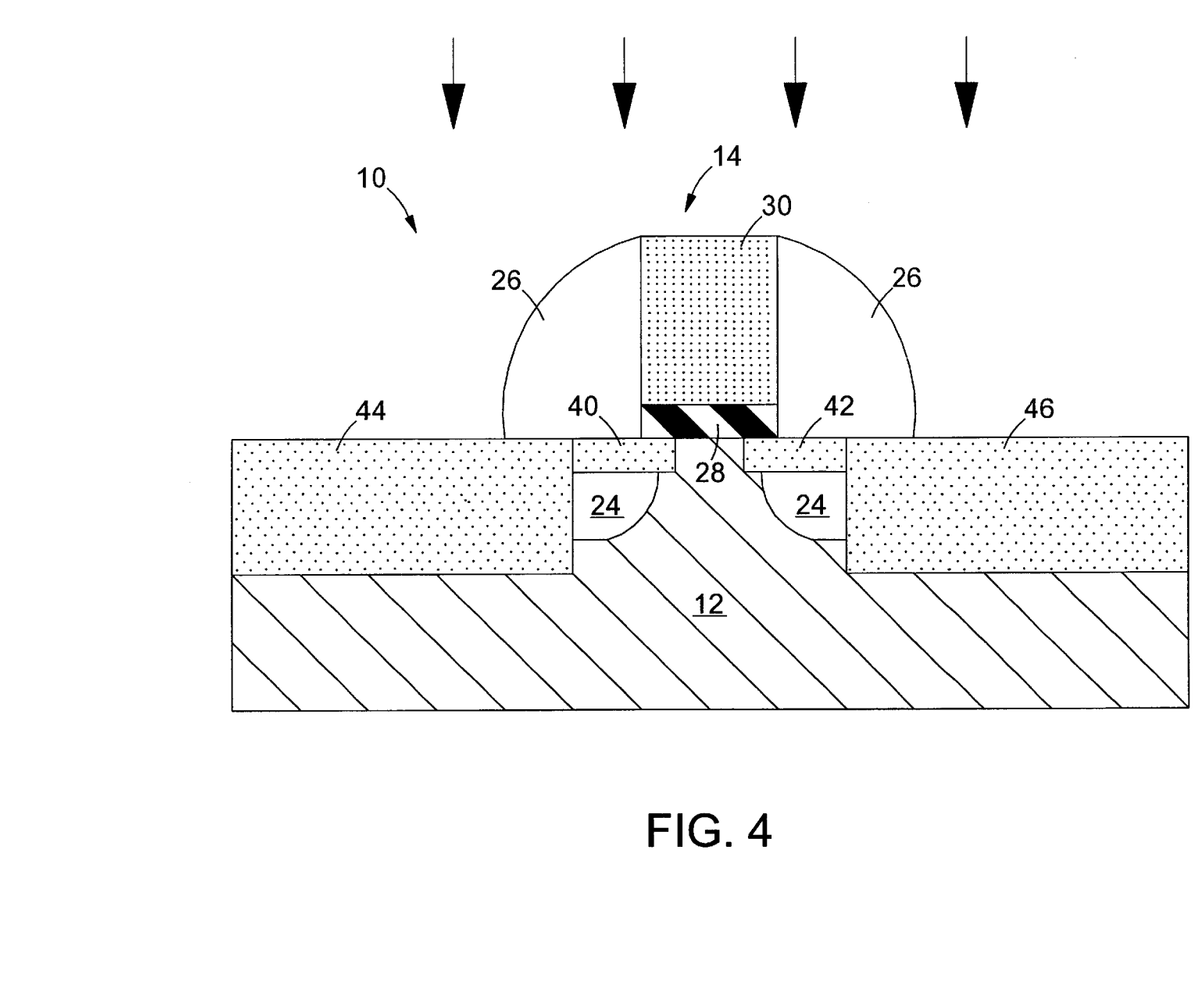
FIG. 4 is a cross-sectional view of a portion of the integrated circuit illustrated in FIG. 3, showing a spacer formation step and a self-amorphization deep source/drain junction implant step.

In FIG. 4, dielectric spacers 26 are formed by ion deposition and etch back processes. Spacers 26 can be an oxide or nitride material. A deep source/drain junction implant is provided under a heavy dose (e.g., between $5\times10^{15}cm^{-2}$ and $1\times10^{16}cm^{-2}$). Under the heavy dose, deep source drain junction regions 44 and 46 become self-amorphized, shown in FIG. 4 as stippled areas. In one embodiment, dopants such as $BF_2$, As, or Sb are used.

The amorphization implant in FIG. 4 is deeper than that in FIG. 3. In an exemplary embodiment, the depth of this deep amorphous region is 50–100 nm. The purpose of the amorphization implant in FIG. 4 is to define the deep S/D junctions. When both shallow S/D extension (layers 40 and 42) and deep S/D junction regions (regions 44 and 46) are amorphized, the dopant can be activated by the same low-temperature anneal for recrystallization (or solid-phase epitaxy). A low temperature (e.g., 500–600° C.) RTA is applied to recrystallize the whole amorphous layer (regions 40, 42, 44, and 46) and form regions 16, 18, 20, and 22 (FIG. 1). In one embodiment, a solid-phase epitaxy process occurs in which all dopants in deep source/drain (regions 44 and 46 in FIG. 4) and shallow source/drain extensions (regions 40 and 42 in FIG. 4) are activated. Conventional CMOS fabrication process steps may then be taken to complete the manufacturing of the IC. In one embodiment, conductor 30 can also be amorphized during the doping steps.

The process described with reference to FIGS. 1–4 is particularly advantageous in light of the need for smaller integrated circuits. As smaller MOSFETs are designed, high-k materials, such as, $Al_2O_3$, $TiO_2$, and $ZrO_2$ are used as the gate insulator. Unfortunately, high-k materials react with silicon at high temperatures. As such, lower temperatures must be used. In an exemplary embodiment of the circuit fabrication process described above, the reaction of high-k materials with high temperatures is avoided by the use of a damascene or sacrificial gate structure. The gate structure is removed after regions 24 are formed and high temperature anneal is formed according to the process described with respect to FIG. 2. A new gate structure is formed after the high temperature anneal. The new gate structure includes a high-k gate insulator the transistor is completed utilizing the process steps described with reference to FIGS. 3, 4, and 1. A very low thermal budget CMOS manufacturing process with self-amorphized source/drain junctions and extensions allow integrated circuits and transistors to be manufactured smaller and smaller.

While the embodiments illustrated in the FIGURES and described above are presently preferred, it should be understood that these embodiments are offered by way of example only. Other embodiments may include, for example, different techniques for selectively annealing various integrated circuit structures. The invention is not limited to a particular embodiment, but extends to various modifications, combinations, and permutations that nevertheless fall within the scope and spirit of the appended claims.

What is claimed is:

1. A method of manufacturing an integrated circuit, the method comprising:

annealing a halo section and a gate structure disposed over a substrate, the annealing using a first temperature;

implanting dopants to form drain and source regions; and annealing the drain and source regions at a second temperature, the second temperature between 200° C. and 300° C. less than the first temperature.

2. The method of claim 1, wherein the step of implanting dopants comprises providing a dopant implant of between $1\times10^{15}cm^{-2}$ and $5\times10^{15}cm^{-2}$.

3. The method of claim 1, wherein the step of annealing drain and source regions at a second temperature comprises providing a furnace anneal.

4. The method of claim 1, wherein the gate structure comprises a gate insulator of a high-k material.

5. The method of claim 1, wherein the step of implanting dopants comprises providing dopants as to self-amorphize drain and source regions.

6. The method of claim 5, wherein the step of annealing at a second temperature comprises recrystallizing the self-amorphized drain and source regions.

7. The method of claim 1, further comprising a solid-phase epitaxy process in which dopants in drain and source regions are activated.

8. A method of manufacturing an integrated circuit, the method comprising:

annealing a halo section and a gate structure disposed over a substrate, the annealing using a first temperature;

implanting dopants to form drain and source regions; and annealing the drain and source regions at a second temperature, the second temperature being at least 200° C. less than the first temperature;

wherein the first temperature is at least 800° C. and the second temperature is approximately between 500° and 600° C.

9. A method of manufacturing an integrated circuit having source and drain regions, the method comprising:

providing a gate structure over a substrate;

implanting dopants into the substrate to produce a halo section;

annealing the gate structure and the halo section at a first temperature;

forming a source region and a drain region after annealing the gate structure and the halo section; and annealing the source and drain regions at a second temperature, the second temperature being less than the first temperature, wherein the second temperature is between 500° C. and 600° C.

10. The method of claim 9, wherein the implanting dopants step produces a halo section having a dopant concentration of approximately $1\times10^{18}$ cm³.

11. The method of claim 9, wherein the gate structure includes a polysilicon gate electrode.

12. The method of claim 9, wherein the first temperature is greater than approximately 800° C.

13. The method of claim 9, wherein the step of forming a source region and a drain region comprises implanting a dopant into the subtrate to form self-amortized source and drain regions.

14. The method of claim 13, wherein annealing the source region and drain region at a second temperature acts to recrystallize the source and drain regions.

15. The method of claim 9, further comprising removing the gate structure and providing a second gate structure over the substrate, the second gate structure including a high-k gate insulator.

16. A method for producing an ultra-large scale integrated circuit comprising:

performing a high temperature rapid thermal anneal on a gate structure and a halo section disposed over a semiconductor substrate;

implanting dopants into the substrate to form self-amorphized source and drain regions; and performing a low temperature rapid thermal anneal on the self-amorphized source and drain regions;

wherein the step of performing a high temperature rapid thermal anneal comprises annealing the gate structure and halo section at a temperature greater than approximately 800° C. and the step of performing a low temperature rapid thermal anneal comprises annealing the self-amorphized source and drain regions at a temperature between approximately 500° C. and 600° C.

17. The method of claim 16, further comprising implanting dopants into the substrate to form self-amorphized source and drain extensions and performing a low temperature rapid thermal anneal on the self-amorphized source and drain extensions.

18. The method of claim 16, wherein the step of implanting dopants step comprises implanting heavy dopants into the substrate at a dose of between approximately $1 \times 10^{15}$ cm$^{-2}$ and $5 \times 10^{15}$ cm$^{-2}$.

19. The method of claim 16, wherein the step of performing a low temperature rapid thermal anneal recrystallizes the self-amorphized source and drain regions.

20. The method of claim 16, further comprising removing the gate structure and providing a second gate structure disposed over the substrate, the second gate structure including a high-k gate insulator.

* * * * *

UNITED STATES PATENT AND TRADEMARK OFFICE
CERTIFICATE OF CORRECTION

PATENT NO.     : 6,630,386 B1
DATED          : October 7, 2003
INVENTOR(S)    : Bin Yu It is certified that error appears in the above-identified patent and that said Letters Patent is hereby corrected as shown below:

<u>Column 6,</u>
Line 54, delete "subtrate" and insert therefor -- substrate --.
Line 54, delete "self-amortized" and insert therefor -- self-amorphized --.

Signed and Sealed this

Thirtieth Day of March, 2004

JON W. DUDAS
*Acting Director of the United States Patent and Trademark Office*